(12) United States Patent
Kemper et al.

(10) Patent No.: US 7,986,034 B2
(45) Date of Patent: Jul. 26, 2011

(54) POWER SEMICONDUCTOR MODULE AND METHOD FOR PRODUCING THE SAME

(75) Inventors: Alfred Kemper, Warstein (DE); Guido Strotmann, Anroechte (DE)

(73) Assignee: Infineon Technologies, AG, Neubiberg (DE)

( * ) Notice: Subject to any disclaimer, the term of this patent is extended or adjusted under 35 U.S.C. 154(b) by 679 days.

(21) Appl. No.: 12/052,863

(22) Filed: Mar. 21, 2008

(65) Prior Publication Data

US 2008/0211091 A1 Sep. 4, 2008

Related U.S. Application Data

(63) Continuation of application No. PCT/EP2006/009195, filed on Sep. 21, 2006.

(30) Foreign Application Priority Data

Sep. 21, 2005 (DE) .................... 10 2005 045 100

(51) Int. Cl.
*H01L 23/49* (2006.01)
*H01L 23/498* (2006.01)
*H01L 21/00* (2006.01)

(52) U.S. Cl. ............ 257/690; 257/E21.499; 257/E21.5; 257/E23.009; 257/E23.023; 438/106

(58) Field of Classification Search .................. 257/773, 257/784, 690, E21.499, E21.5, E23.009, 257/E23.023; 438/106
See application file for complete search history.

(56) References Cited

U.S. PATENT DOCUMENTS

| 3,507,033 | A | | 4/1970 | Coucoulas |
| 4,714,953 | A | * | 12/1987 | Buller et al. ................. 257/713 |
| 5,277,356 | A | | 1/1994 | Kawauchi |
| 5,354,392 | A | | 10/1994 | Santo et al. |
| 5,403,785 | A | | 4/1995 | Arai et al. |
| 5,492,842 | A | * | 2/1996 | Eytcheson et al. ............. 438/15 |
| 5,503,321 | A | | 4/1996 | Urushima |
| 5,539,254 | A | * | 7/1996 | Eytcheson et al. ............ 257/691 |
| 5,642,852 | A | | 7/1997 | Suzuki et al. |
| 7,098,683 | B2 | * | 8/2006 | Matsubara et al. ........... 318/490 |
| 7,633,166 | B2 | * | 12/2009 | Nagase et al. ................. 257/773 |
| 2003/0112605 | A1 | | 6/2003 | Hable |

FOREIGN PATENT DOCUMENTS

| EP | 0523547 | 1/1993 |
| GB | 1139035 | 1/1969 |
| JP | 2000232189 | 8/2000 |
| JP | 2002164461 | 6/2002 |
| JP | 2002313851 | 10/2002 |
| JP | 2003188310 | 7/2003 |
| JP | 2003198077 | 7/2003 |

* cited by examiner

*Primary Examiner* — Evan Pert
(74) *Attorney, Agent, or Firm* — Edell, Shapiro & Finnan, LLC

(57) ABSTRACT

A method for producing a power semiconductor module including forming a contact between a contact region and a contact element as an ultrasonic welding contact via a sonotrode. The ultrasonic welding operation also being used for joining the contact regions with the contact ends and consequently for joining the contacts and the foot regions.

29 Claims, 7 Drawing Sheets

POWER SEMICONDUCTOR MODULE AND METHOD FOR PRODUCING THE SAME

CROSS REFERENCE TO RELATED APPLICATIONS

This application is a continuation of International Application No. PCT/EP2006/009195, filed on Sep. 21, 2006, entitled "Power Semiconductor Module and a Method for the Production Thereof," which claims priority under 35 U.S.C. §119 to Application No. DE 102005045100.4 filed on Sep. 21, 2005, entitled "Power Semiconductor Module and a Method for the Production Thereof," the entire contents of which are hereby incorporated by reference.

BACKGROUND

In the construction of modern power semiconductor modules, for making contact with sections of an underlying power semiconductor circuit or for making contact with the latter externally, contact regions are contact-connected and connected to contact elements (e.g., strip-type current taps or current connections comprising or composed of, for example, copper). Contacts have been or are formed on the basis of connections which presuppose a comparatively limited operating temperature (e.g., below 125° C.). Even with improvement of corresponding soldering connections, this operating temperature limit can hardly be raised.

SUMMARY

Described herein are a power semiconductor module and a method for producing the same in which corresponding contacts with extended operating temperature ranges can be formed in a particularly simple yet reliable manner. Furthermore, the connection of current taps or current connections in power semiconductor modules via ultrasonic welding is also described herein.

In the method for producing a power semiconductor module and in the power semiconductor module, contacts are formed via ultrasonic welding by virtue of a sonotrode. The ultrasonic welding operation can also be used for joining the contact regions with the contact ends and consequently for joining the contacts and the foot regions of the power semiconductor module.

BRIEF DESCRIPTION OF THE DRAWINGS

These and further aspects are also explained in more detail with reference to schematic drawings, where.

DETAILED DESCRIPTION

In the following, functionally and/or structurally similar or comparable elements are designated by the same reference symbols without a detailed description being given or repeated each time they occur. The aspects, features and properties as mentioned before and as to be mentioned as follows may be combined with each other in an arbitrary manner.

A proposed method is for producing a power semiconductor module, in which a power semiconductor circuit is formed with at least one first contact region for making electrical contact with the circuit, in which a contact element with at least one first contact end is furthermore formed for making electrical contact with the power semiconductor circuit, in which at least the first contact end is mechanically and electrically connected to the first contact region to form a first contact, and in which a respective contact is formed via ultrasonic welding, by virtue of a sonotrode that is used for the ultrasonic welding operation also being used for joining the contact end with the contact regions and consequently for joining the contacts, wherein solid copper or primarily copper-containing current taps are used as contact elements, having a material thickness within the range of approximately 0.1 mm to approximately 3.0 mm and having a current-carrying capacity within the range of approximately 50 A to approximately 2000 A, wherein at least some of the contact regions are formed by a direct copper bonding (DCB) substrate within a copper or primarily copper-containing layer having a material thickness within the range of approximately 0.1 mm to approximately 1.0 mm, wherein an ultrasonic welding power within the range of approximately 300 W to approximately 10 kW is used, and wherein a normal force to or for the sonotrode within the range of approximately 500 N to approximately 3500 N is used as joining force.

The surfaces of current taps or current connections and of the substrates can be formed with or from Cu, Ni, NiPdAu, Pd, Ag, Sn, Zn and/or Al.

Current taps can be used having a material thickness within the range of approximately 0.8 mm to approximately 1.5 mm.

Current taps can be used having a current-carrying capacity within the range of approximately 300 A to approximately 2000 A, optionally within the range of approximately 300 A to approximately 1000 A.

A DCB substrate with a copper or primarily copper-containing layer having a material thickness within the range of approximately 0.25 mm to approximately 0.6 mm is used.

The ultrasonic welding power lies within the range of approximately 500 W to approximately 2 kW.

The frequency for the ultrasonic welding lies within the range of approximately 20 kHz to approximately 35 kHz.

The energy for the ultrasonic welding lies within the range of approximately 50 Ws to approximately 3 kWs, optionally within the range of approximately 50 Ws to approximately 800 Ws.

The amplitude for the ultrasonic welding lies within the range of approximately 15 µm to approximately 50 µm, optionally within the range of approximately 25 µm to approximately 35 µm.

The welding time for the ultrasonic welding lies within the range of approximately 50 ms to approximately 2000 ms, optionally within the range of approximately 100 ms to approximately 500 ms.

The first contact ends of the contact elements are formed with energy direction indicators in the form of elevations at the first contact ends for better force alignment during ultrasonic welding.

The energy direction indicators have a material thickness within the range of approximately 0.05 mm to approximately 0.50 mm, optionally within the range of approximately 0.10 mm to approximately 0.20 mm.

The energy direction indicators have a diameter within the range of approximately 0.5 mm to approximately 4.0 mm, optionally within the range of approximately 1.0 mm to approximately 1.5 mm.

The energy direction indicators have an area within the range of approximately 0.2 mm² to approximately 12.5 mm², optionally within the range of approximately 0.8 mm² to approximately 1.8 mm².

Prior to the actual ultrasonic welding operation, a calibration operation is carried out, in which pressure is simultaneously exerted on a plurality of contact ends via the sonotrode until all the energy direction indicators are mechanically contact-connected.

The ultrasonic welding is carried out as a simultaneous multiple welding operation, in which a plurality of contact elements are simultaneously contact-connected via a plurality of contact ends, in particular with a respective current-carrying capacity within the range of approximately 50 A to approximately 500 A.

In this case, it is conceivable that, in addition, prior to the actual ultrasonic welding operation, the sonotrode is lowered on to the contact region, such that the respective contact end is thereby pressed under force or pressure on to the surface of the respective contact region.

Furthermore, it is additionally or alternatively conceivable that a respective contact element is first held and positioned via a holding and positioning device and the joining and fixing are then effected via the sonotrode.

Furthermore, in one development of the method for producing a power semiconductor module it is provided that the respective contact end of the contact element is contact-connected at a single location or at a single point as an individual foot region for the current and/or potential transmission.

In an alternative or additional development of the method for producing a power semiconductor module it is provided that the respective contact end of the contact element is contact-connected at a plurality of locations or at a plurality of points as a plurality of foot regions for the current and/or potential transmission.

In a further alternative or additional development of the method for producing a power semiconductor module it is provided that the respective contact element is formed as an element from the group consisting of: contact wires, bonding wires, litz wires and stamped parts.

In a alternative or additional configuration of the method for producing a power semiconductor module it is provided that a contact element is formed with or from a material or any desired combination of materials from the group formed by copper and aluminum.

In a further alternative or additional configuration of the method for producing a power semiconductor module it is provided that the contact end and/or the contact are formed in meandering fashion (e.g., alternating configuration).

The contact region can be formed as a pad.

In particular, also a power semiconductor module is provided in which a power semiconductor circuit is formed with at least one first contact region for making electrical contact with the circuit, in which a contact element with at least one first contact end is furthermore formed for making electrical contact with the power semiconductor circuit, in which at least the first contact element is mechanically and electrically connected to the first contact region to form a first contact, and in which a respective contact is formed as an ultrasonic welding contact.

In one development of the power semiconductor module produced, as described above, it is provided that the respective contact end of the contact element is contact-connected at a single location or at a single point as an individual foot region for the current and/or potential transmission.

In an alternative or additional development of the power semiconductor module it is provided that the respective contact end of the contact element is contact-connected at a plurality of locations or at a plurality of points as a plurality of foot regions for the current and/or potential transmission.

In a further alternative or additional development of the power semiconductor module produced as described above it is provided that the respective contact element is formed as an element from the group consisting of: litz wires and stamped parts.

In an alternative or additional configuration of the power semiconductor module produced as described above it is provided that a contact element is formed with or from a material or any desired combination of materials from the group formed by copper and aluminum.

In a further alternative or additional configuration of the power semiconductor module produced as described above it is provided that the contact end and/or the contact are formed in meandering fashion.

The contact region can correspondingly be formed as a pad.

In accordance with another aspect, the subject matter relates to a power semiconductor module which is or has been formed in accordance with the method as described above.

The power semiconductor module proposed can include at least one current tap as contact element which in turn comprises at least two first contact ends contact-connected via contacts with contact regions, in particular in the form of so-called feet or foot points.

In the vicinity of edge regions of the contact regions of the DCB substrate, the contacts formed can be at a minimum distance from the edge regions which approximately corresponds to the thickness of the contact end contact-connected with the respective contact, in particular within the range of approximately 0.5 mm to approximately 1.5 mm.

In the vicinity of edge regions of the contact regions of the DCB substrate, the welded area of a contact can be at a minimum distance from the edge regions which approximately corresponds to the thickness of the contact ends contact-connected with the respective contact, in particular within the range of approximately 0.5 mm to approximately 1.5 mm.

The welded area of a contact can correspond approximately to one to three times the cross-sectional area of the respective contact element in the region of the respective contact end.

Figure 1A:
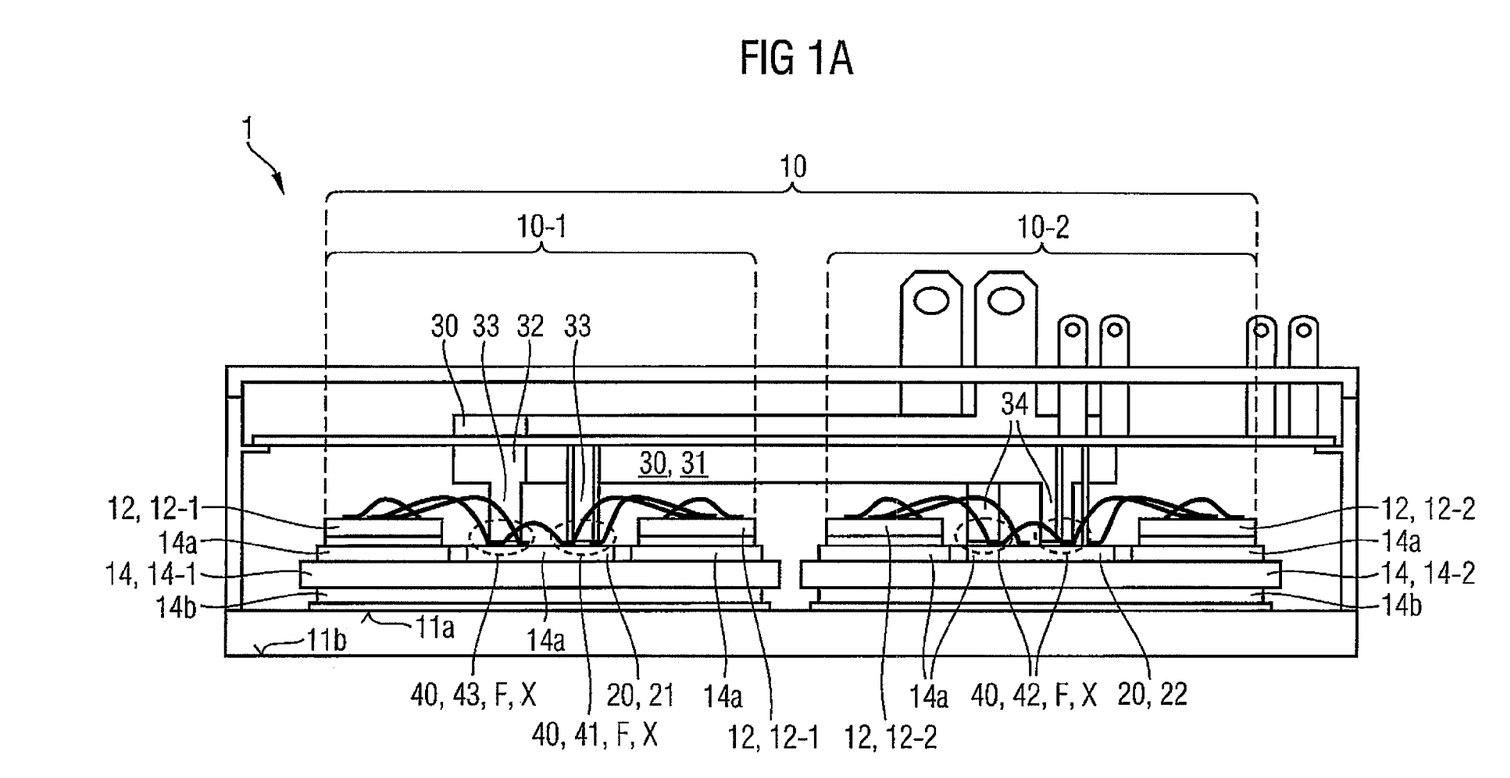
FIG. 1A shows in schematic and sectional side view one embodiment of a power semiconductor module.

FIG. 1A is a schematic and sectional side view of a first embodiment of the power semiconductor module 1.

The embodiment of the power semiconductor module 1 as illustrated in FIG. 1A is based on a carrier 11, composed of, for example, a copper, aluminum or MMC base plate, which has a top side 11a and an underside 11b. In the embodiment illustrated in FIG. 1, two substrates or substrate regions 14, 14-1 and 14, 14-2 are provided on the top side 11a of the carrier 11, the substrates or substrate regions being spatially at a distance from one another. The substrates or substrate regions 14, 14-1, 14-2 can be metal-ceramic-metal composite materials (e.g., DCB substrates).

The first substrate or the first substrate region 14-1 corresponds to a first circuit region 10-1 of the semiconductor circuit 10 forming the basis of the power semiconductor module 1, furthermore, for example, a first semiconductor material region 12, 12-1 is provided on the surface 14a of the first substrate region 14-1 and a corresponding assembly is formed therein, which can also consist of an individual element, whereas the second substrate or the second substrate region 14, 14-2 corresponds to a second circuit region 10-2 of the semiconductor circuit 10 forming the basis of the power semiconductor module 1, furthermore, for example, a second semiconductor material region 12, 12-2 is provided on the surface 14a of the second substrate region 14-2 and a corresponding assembly is formed therein.

Metallic regions are formed in a circuit-conforming manner on the top sides 14a of the first and second substrate regions 14, 14-1 and 14, 14-2. The undersides 14b of the first and second substrate regions 14, 14-1 and 14, 14-2 are plated-through with metallic regions and serve, if appropriate, for contact-connection and fitting on the top side 11a of a base plate 11.

Various contact regions 20 (e.g., in the form of pads or the like), are provided on the top side 14a of the substrate regions 14-1 and 14-2. A first contact region 21 is formed on the first substrate region 14-1. Second and third contact regions 22 and 23, respectively, are formed on the second carrier region 14-2.

Corresponding contact elements 30 including first and second contact ends 33 and 34, respectively, are provided for contact-connecting the semiconductor material regions 12-1 and 12-2 and the corresponding circuit regions 10-1 and 10-2 to one another and toward the outside. Thus, for example, a first contact element 31, here in the form of a stamped part as a solid current tap, is provided for contact-connecting the first and second circuit regions 10-1 and 10-2 to one another via the first and second contact regions 21 and 22, respectively. In this case, the first contact end 33 of the first contact element 31 is electrically or mechanically contact-connected to the first contact region 21 on the first substrate region 14-1, whereas the second end 34 of the first contact element 31 is contact-connected on the second contact region 22 on the second substrate region 14-2.

Contacts 40 are respectively formed in this way, namely a first contact 41 in the region of the first contact region 21 with the first contact end 33 of the first contact element 31 on the surface 14a of the first substrate region 14-1 and a second contact 42 in the region of the second contact region 22 on the second substrate region 12-2 using the second contact end 34 of the first contact element 31 on the surface 14a of the second substrate region 14-2.

The second contact element 32 provided in the embodiment of FIG. 1A is used for a different form of contact-connection of the first circuit region 10-1, namely by forming a third contact 43 in the region of the first contact region 21 of the first substrate region 14-1, wherein the first contact end 33 of the second contact element 32 is contact-connected on the first contact region 21 on the surface 14a of the first substrate region 14-1.

The contacts 40-43 thus formed are present as ultrasonic welding contacts.

The power semiconductor module 1 can also be formed on the basis of just one continuous semiconductor material region 12 or with a higher plurality of semiconductor material regions 12. Furthermore, it is possible to provide more or fewer contact regions 20 than illustrated in FIG. 1A.

Figure 1B:
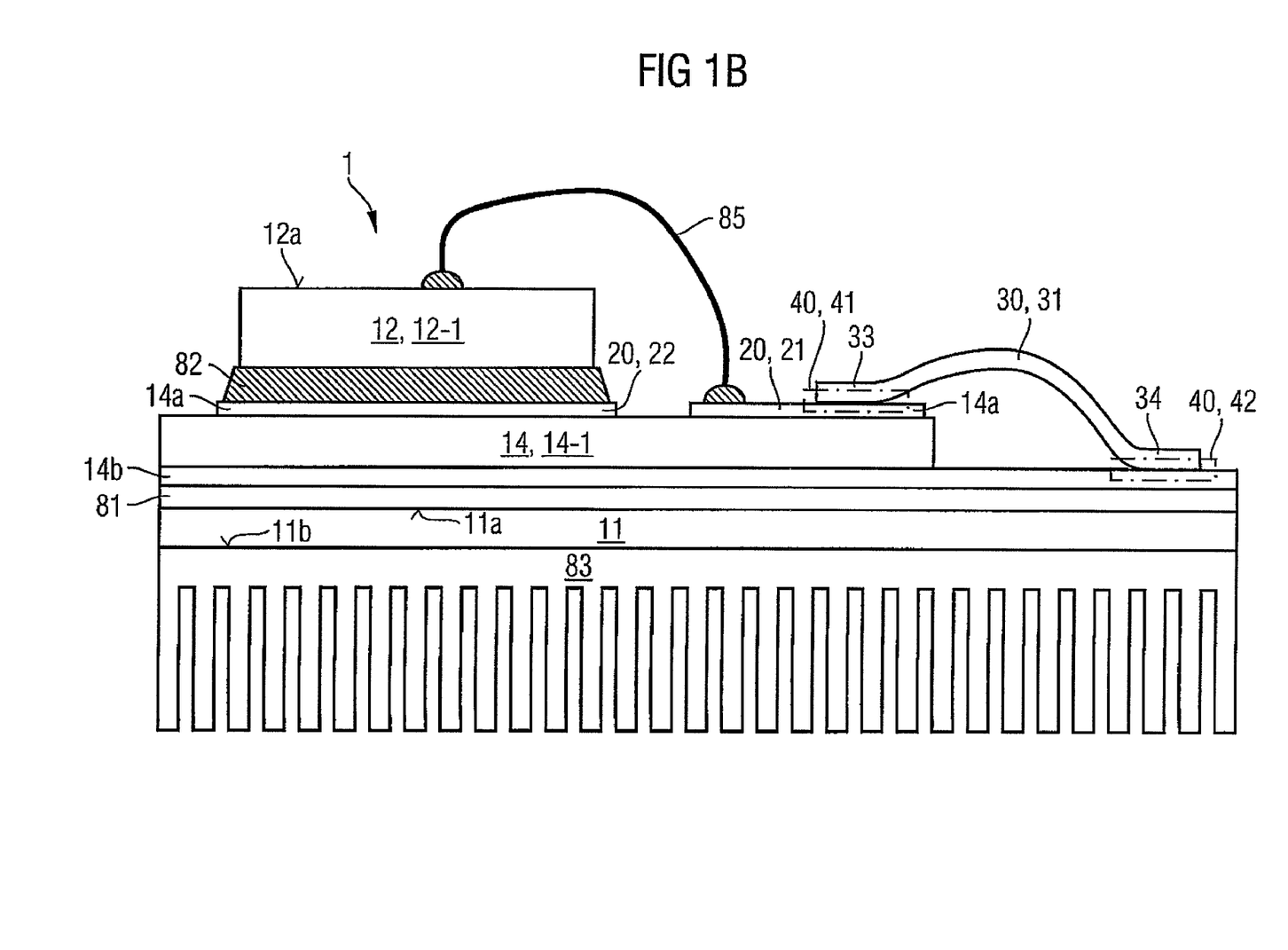
FIG. 1B-D show schematic views of further embodiments of the power semiconductor module.
Figure 1C:
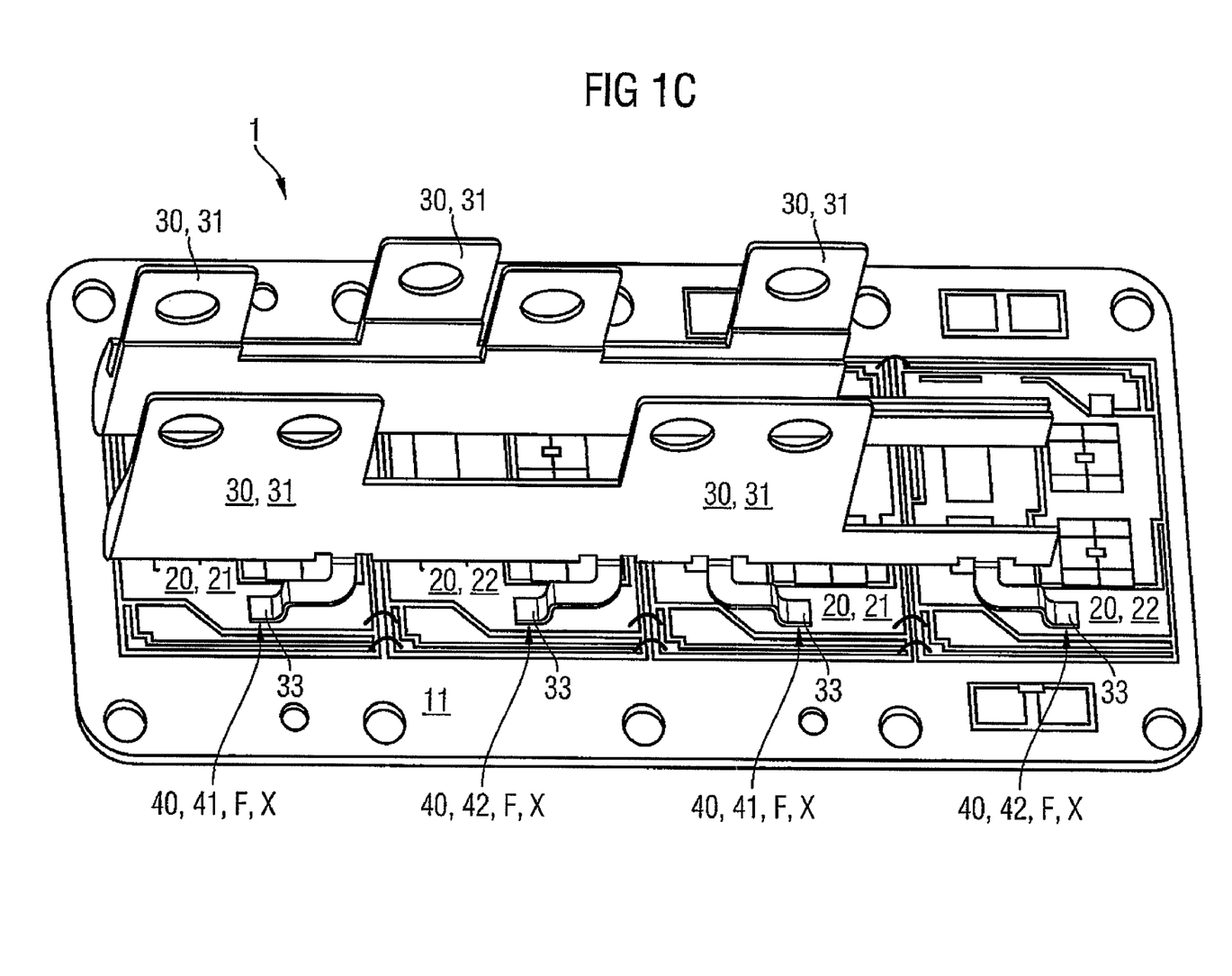
Figure 1D:
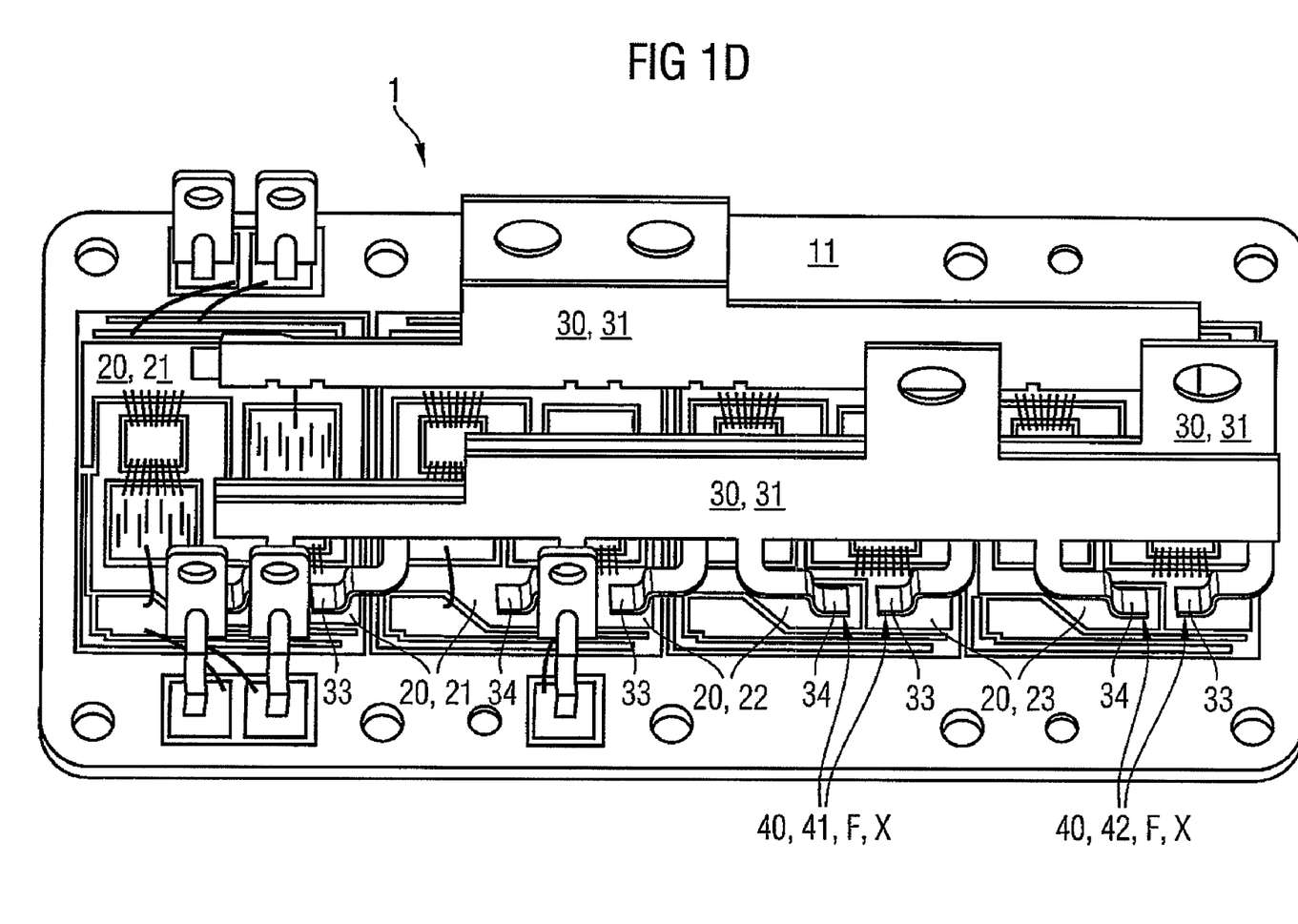

FIGS. 1B to 1D show other embodiments of power semiconductor modules 1, wherein the contact elements 30, 31, 32 are in each case configured as so-called current taps and—in the embodiments in accordance with FIGS. 1C and 1D—via a plurality of contact ends 33, 34, can also realize a plurality of contacts 40, 41, 42, 43, wherein the latter may optionally be formed simultaneously.

In FIG. 1B, the carrier 11 as base plate is arranged with its underside 11b on a cooling member as heat sink 83. On the top side 11a of the carrier, via a first solder agent 81, the substrate region 14, 14-1 (e.g., a DCB substrate), is provided, the underside 14b of which is a continuous metallization and the top side 14a of which is a metallization structured in circuit-conforming fashion.

On the left-hand side of the top side 14a of the substrate region 14, 14-1, a semiconductor material region 12, 12-1 or chip with a semiconductor circuit 10 contained therein is provided by its underside 12b via a second solder agent 82. The top side 12a of the semiconductor material region 12, 12-1 is contact-connected via a bonding wire 85 to a part—arranged on the right—of the metallic top side 14a of the substrate region 14, 14-1, by which a contact region 20, 21 is formed. On the contact region 20, 21, via a first contact 40, 41 and a first contact end 33, a contact element 30, 31 in the form of a solid current tap is connected and leads via a second contact end 34 to a second contact 40, 42 formed by an uncovered part of the metallization of the underside 14b of the substrate region 14, 14-1.

FIGS. 1C and 1D show in perspective plan view two other embodiments of the power semiconductor module 1 formed as described above, wherein alongside contact elements with only one contact end, provision is also made in each case of a plurality of contact elements 30, 31, 32 in the form of solid current taps each including a plurality of contact ends 33, 34 for forming a plurality of contacts 40-43 or foot points F at different locations X, which are formed in particular simultaneously via joining ultrasonic welding.

Figure 2:
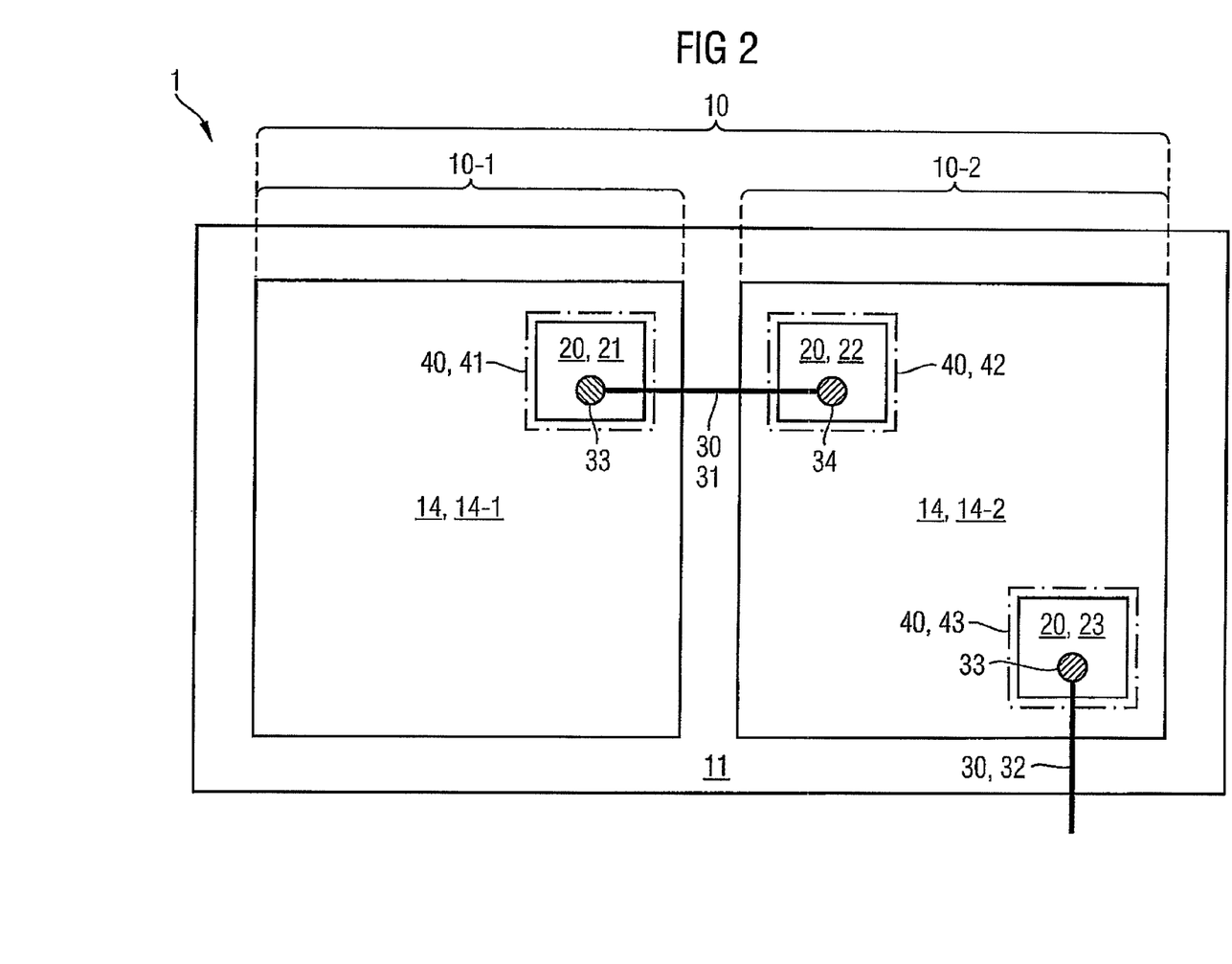
FIG. 2 shows in schematic plan view the embodiment of a power semiconductor module produced in accordance with FIG. 1A.

FIG. 2 is a schematic plan view of another embodiment of the power semiconductor module 1. The individual circuit regions 10-1 and 10-2 are not shown in detail here, rather the contact regions 20, 21, 22, 23 on the substrate regions 14, 14-1, 14-2 are discussed.

The embodiment of the power semiconductor module 1 as illustrated in FIG. 2 is again based on a carrier 11, comprising a copper base plate, which has a top side 11a and an underside 11b. In the embodiment illustrated in FIG. 2, two substrate regions 14, 14-1, 14-2 are provided on the top side 11a of the carrier 11, the substrate regions being spatially at a distance from one another. The first substrate region 14-1 corresponds to a first circuit region 10-1 of the semiconductor circuit 10 forming the basis of the power semiconductor module 1, whereas the second substrate region 14-2 corresponds to a second circuit region 10-2 of the semiconductor circuit 10 forming the basis of the power semiconductor module 1.

The substrate regions 14-1 and 14-2, for their part, likewise include, in each case, a top side 14a and an underside 14b. Consequently, the underside 14b of the respective substrate region 14, 14-1, 14-2 is respectively applied on the top side 11a of the underlying carrier 11.

Various contact regions 20 (e.g., in the form of pads or the like) are provided on the top side 14a of the substrate regions 14-1 and 14-2. A first contact region 21 is formed on the first substrate region 14-1. Second and third contact regions 22 and 23, respectively, are formed on the second substrate region 14-2.

Corresponding contact elements 30 comprising first and second contact ends 33 and 34, respectively, are provided for contact-connecting the substrate regions 14-1 and 14-2 and, if appropriate, the corresponding circuit regions 10-1 and 10-2 toward the outside. Thus, for example, a first contact element 31 is provided for contact-connecting the first and second substrate regions 14-1 and 14-2 to one another via the first and second contact regions 21 and 22, respectively. In this case, the first contact end 33 of the first contact element 31 is electrically and mechanically contact-connected to the first contact region 21 on the first substrate region 14-1 whereas the second end 34 of the first contact element 31 is contact-connected on the second contact region 22 on the second substrate region 14-2. Contacts 40 are again formed in this way, namely a first contact 41 in the region of the first contact region 21 with the first contact end 33 of the first contact element 31 on the first substrate region 14-1, and a second contact 42 in the region of the second contact region 22 on the second substrate region 14-2 using the second contact end 34 of the first contact element 31.

The second contact element 32 provided in the embodiment of FIG. 2 serves for externally contact-connecting the entire semiconductor circuit 10, namely by forming a third contact 43 in the region of the third contact region 23 of the second substrate region 12-2, wherein the first contact end 33 of the second contact element 32 is contact-connected on the third contact region 23 of the surface 14a of the second substrate region 14-2. The second contact element 32 then extends beyond the actual power semiconductor module 1 externally.

The contacts 40-43 are again formed as ultrasonic welding contacts.

Figure 3:
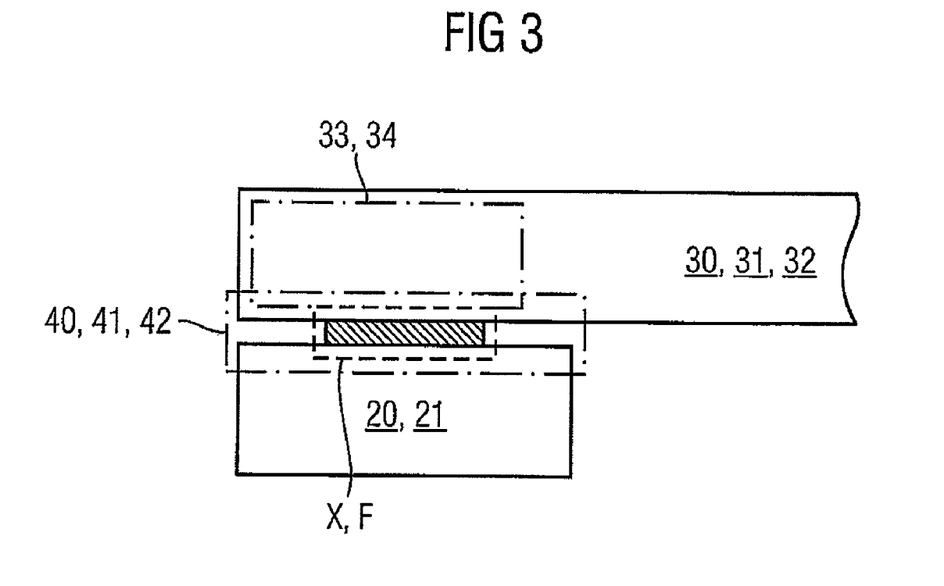
FIG. 3 shows in schematic and sectional side view a detail of another embodiment of the power semiconductor module.

FIG. 3 shows in schematic and sectional side view the contacts 40-43 formed by ultrasonic welding between a contact element 30-32 and a contact region 20-22. In the embodiment of FIG. 3, a single foot region F for the transmission of current and/or potential is formed in this case by ultrasonic welding at an individual and single location X between the first or second contact end 33 or 34, respectively of the contact element 30-32.

Figure 4:
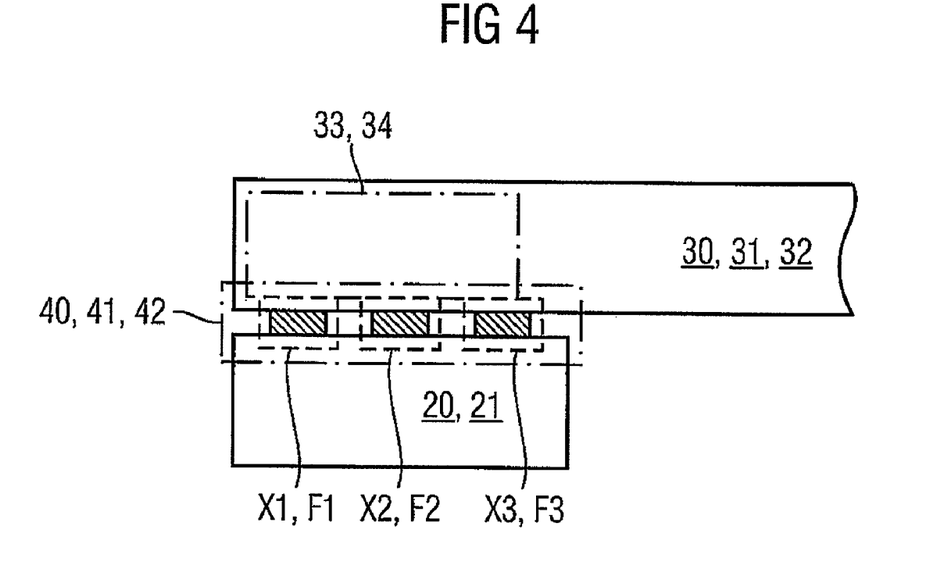
FIG. 4 shows in schematic and sectional side view a detail of another embodiment of the power semiconductor module.

In the embodiment of FIG. 4, by contrast, a corresponding plurality of foot regions F1, F2 and F3 for the transmission of electric current and/or electric potential are formed by ultrasonic welding during the production of the contacts 40-42 at a plurality of points or locations, namely at three points or locations X1, X2 and X3.

FIGS. 5A to 5D show in schematic and sectional side view intermediate stages attained in an embodiment of the method for producing a power semiconductor module.

Figure 5A:
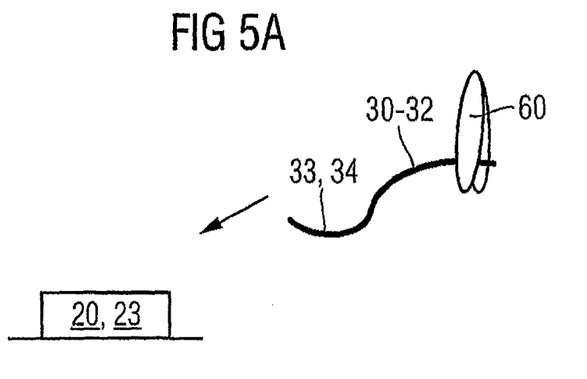
FIG. 5A-D show in schematic and sectional side view intermediate stages attained in an embodiment of the method for producing a power semiconductor module.

As is illustrated in FIG. 5A, first a contact element 30-32 (e.g., a stamped part or a bonding wire or the like) is provided. For this purpose, the contact element 30-32 is grasped by a holding and positioning device 60 and correspondingly brought by positioning to a contact region 20-23.

Figure 5B:
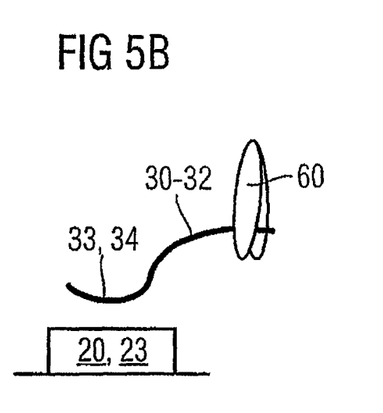

As a result, the intermediate state shown in FIG. 5B is attained, in which the contact element 30-32 is positioned in such a way that the corresponding contact end 33, 34 of the contact element 30-32 is arranged just above the contact region 20-23, but need not necessarily touch the latter with the contact end 33, 34.

Figure 5C:
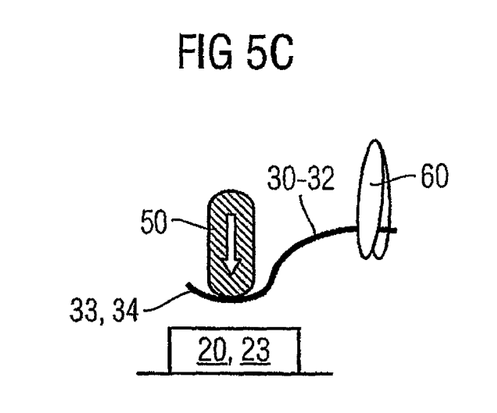

In the transition to the intermediate state shown in FIG. 5C, with unchanged positioning of the contact element 30-32 via the holding and positioning device 60, a sonotrode 50 is then brought to the contact end 33, 34 of the contact element 30-32 such that a region of the contact end 33, 34 is thereby touched and, with expenditure of force or by pressure, represented by the white arrow, is moved toward the contact region 20-23.

Figure 5D:
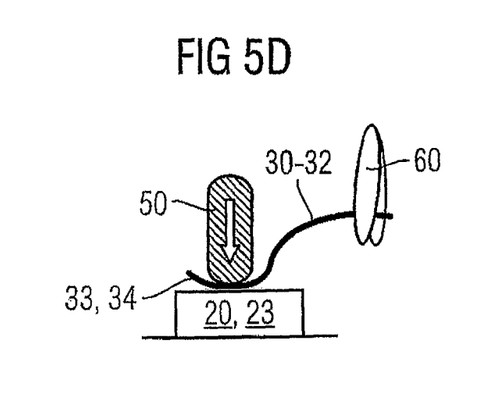

This is done such that the intermediate state shown in FIG. 5D is established, in which, under the expenditure of force or pressure via the sonotrode 50, the contact end 33, 34 of the contact element 30-32 is in mechanical and electrical contact with the surface of the contact region 20-23. In the intermediate state shown in FIG. 5D, the sonotrode 50 is then also activated for the ultrasonic welding in order then to form the corresponding contact 40-43 between the contact region 20-23 and the contact end 33, 34 as ultrasonic welding contacts.

The procedure as illustrated in accordance with FIGS. 5A to 5D has the advantage that all forms of contact elements 30-32 can be processed and contact-connected.

These can involve contact elements 30-32 which realize an external contact-connection of a semiconductor module 1 toward the outside and, consequently, are or have been contact-connected only with a single contact end 33 in the region of the semiconductor circuit arrangement 10. However, they can also involve internal contact elements 30, 31 which contact-connect different semiconductor circuit regions 10-1 and 10-2 to one another within a housing of the module.

In contrast to known production methods, therefore, an external fixing of the contact elements 30-32 to be contact-connected, for example, in the region of a housing frame or in the region of a potting compound, is not necessary here. This arises from the circumstance that here the sonotrode 50 itself is used for the mechanical end positioning of the contact ends 33, 34 by pressure onto the surface of the contact regions 20-23 to be contact-connected, wherein a corresponding joining process between the individual parts to be joined (e.g., the contact elements 30-32 and the contact regions 20-23) is therefore effected simultaneously.

These and further aspects are also explained in more detail on the basis of the observations below:

The subject matter also relates, in particular to the connection of current taps in power semiconductor modules via ultrasonic welding.

In the construction of power semiconductor modules, electrically conductive connections are required for carrying current from the ceramic to the external connections and on the ceramics among one another. Connections which are thermally stable under alternating load and which enable an operating temperature of 200° C. are sought here. The contact-connection of the connections may be embodied by soldering connection or bonding technology, which is thus limited to an operating temperature of 125° C.

The soldering connections may be carried out with the aid of soldering devices in a soldering furnace (continuous or batch furnace if appropriate with vacuum). During the soldering process, the current tap moves in the course of the melting of the solder in the direction of the substrate or the solder flows in from a deposit. In this case, on account of the tolerances (component tolerances generally, thermal expansions, change of flexures), it is possible to establish an identical layer thickness of the solder or support only at two points of the current tap (two foot points). With two soldering points per current tap, a uniform solder layer thickness cannot actually always be complied with, and with more than two soldering points, a uniform solder layer cannot be achieved and the reliability of the connection is severely influenced, under certain circumstances.

Furthermore, connections between substrates among one another and from substrates to current taps injected or plugged in the housing can be produced via aluminum wires and bonding technology. The currents controlled here are limited on account of the cross sections of the aluminum wires and thus the associated current-carrying capacity and also the available areas.

In the context of thermal alternating loads, the soldering connection itself may be limited to an operating temperature of max. 125° C. An operating temperature of 200° C., demanded particularly by automotive users, cannot be achieved with soldering connections.

Furthermore, as the solder layer rises, the electrical resistance of the connection increases and the thermal loading during operation thus again increases. Generally, the mechanical strength of a soldering connection decreases greatly as the temperature rises.

The ultrasonic welding method produces metallic cohesive connections which are stable even at an operating temperature of 200° C. in terms of the thermal alternating load behavior. The electrical contact resistances at the connection points are absolutely uniform and very small in comparison with the soldering connections. This is achieved by the cohesive connection of the ultrasonic welding of the two contact partners. A further major advantage is the significantly better automation capability of the ultrasonic process in comparison with soldering processes in vacuum furnaces.

A way of securely joining the contact locations is shown—irrespective of whether one, two or more contact locations of a current tap are involved. The contact locations of the current tap can be situated on one or a plurality of substrates or the housing. The thickness tolerance of the substrates or structurally governed height differences of the contact locations do not pose any problems here in comparison with soldering.

It is proposed to use the sonotrode of the welding installation for joining the feet of the current tap before the actual welding operation. In other words, the sonotrode is lowered in the welding process onto the current tap's foot to be welded and presses it in a force-dependent manner until contact to the substrate has been established. The foot of the current tap is constructed in such a way that it is provided with a type of meander in order to permit expansions of the module during operation (as also required during the operation of a power semiconductor module). The actual joining process is then effected via ultrasonic welding.

During the soldering process, the current taps are premounted in floating fashion in relatively complicated soldering preforms in such a way that they move in the soldering and cooling process and descend into the liquid solder.

During the ultrasonic welding, the current taps are fixedly clamped in a device or brought to the welding location by handling. Movement and descent of the entire current tap is not necessary, in contrast to the soldering. It is thereby possible also to realize joining situations which are unfeasible with a soldering process in soldering preforms.

Cohesive connection of one or a plurality of contact points of a current lead in a module. These current leads can both be injected in the housing walls and be welded onto the ceramic substrates freely in the module. It is possible to weld copper—copper connections and also other metallic connections.

The connection of the contact points takes place via cold welding at room temperature, hence no thermal loading of the components in the case of the connections of the foot points.

Uniform contact resistances at the contact locations even in the case of a plurality of foot points, and so different electrical contact resistances as in the case of soldering are ruled out.

According to the proposal tolerance-independent joining and connecting of one or a plurality of foot points is possible. This method also enables connections in a power semiconductor module on different mounting planes via different current leads (e.g., flexible litz wires, wires, stamped parts, and etc.). This results in totally new interconnection possibilities in horizontal and vertical extend which cannot be realized with soldering methods.

The production of thermally stable circuits via high-current connections in a power semiconductor module is also possible according to the proposal.

The contact points can also lie in a plastic housing that is not resistant to high temperatures, because the plastic housing is no longer subjected to a hot process (e.g., soldering). The mounting sequence of a semiconductor module is considerably simplified in comparison with soldering by virtue of the heating no longer being required, and becomes significantly more flexible.

For example, six foot points per current tap were welded onto different substrates. The height tolerances present were compensated for by joining via a sonotrode prior to welding.

What is claimed is:

1. A method for producing a power semiconductor module, the method comprising:
    mechanically and electrically connecting a first contact end of a contact element of the power semiconductor module to a first contact region of a power semiconductor circuit of the power semiconductor module via ultrasonic welding, thereby forming a first contact; and
    joining a further contact end of the contact element with a further contact region of the semiconductor circuit via ultrasonic welding, thereby forming a further contact electrically and mechanically connected to the first contact;
    wherein the contact element is a current tap made of solid copper or substantially copper-containing alloy with a material thickness between approximately 0.1 mm and approximately 3.0 mm and a current-carrying capacity between approximately 50 A and approximately 2000 A;
    wherein at least one of the contact regions is formed by a copper or substantially copper-containing layer of a direct copper bonding DCB substrate, the layer having a material thickness between approximately 0.1 mm and approximately 1.0 mm;
    wherein the ultrasonic welding is performed via a sontrode with an ultrasonic welding power between approximately 300 W and 10 kW and a joining force between approximately 500 N and 3500 N.

2. The method according to claim 1, wherein the current taps have a material thickness between approximately 0.8 mm and approximately 1.5 mm.

3. The method according to claim 1, wherein the current taps have a current-carrying capacity between approximately 300 A and approximately 1000 A.

4. The method according to claim 1, wherein the DCB substrate with a copper or primarily copper-containing layer has a material thickness between approximately 0.25 mm and approximately 0.6 mm.

5. The method according to claims 1, wherein the ultrasonic welding power lies between approximately 500 W and approximately 2 kW.

6. The method according to claim 1, wherein the frequency for the ultrasonic welding lies between approximately 20 kHz and approximately 35 kHz.

7. The method according to claim 1, wherein the energy for the ultrasonic welding lies between approximately 50 Ws and approximately 3 kWs.

8. The method according to claim 1, wherein the amplitude for the ultrasonic welding lies between approximately 15 μm and approximately 50 μm.

9. The method according to claim 1, wherein the welding time for the ultrasonic welding is between approximately 50 ms and approximately 2000 ms.

10. The method according to claim 1, wherein the first contact ends of the contact elements are formed with energy direction indicators in the form of elevations at the first contact ends for better force alignment during ultrasonic welding.

11. The method according to claim 10, wherein the energy direction indicators have a material thickness between approximately 0.05 mm and approximately 0.50 mm.

12. The method according to claim 10, wherein the energy direction indicators have a diameter between approximately 0.5 mm and approximately 4.0 mm.

13. The method according to claim 10, wherein the energy direction indicators have an area between approximately 0.2 mm² and approximately 12.5 mm².

14. The method according to claim 10, further comprising:
performing a calibration operation including exerting pressure simultaneously on a plurality of contact ends via the sonotrode until all the energy direction indicators are mechanically contact-connected.

15. The method according to claim 1, wherein the ultrasonic welding is performed as a simultaneous multiple welding operation including simultaneously contact-connecting a plurality of contact elements via a plurality of contact ends with a respective current-carrying capacity between approximately 50 A and approximately 500 A.

16. The method according to claim 1, wherein the ultrasonic welding operation includes lowering the sonotrode onto the contact region such that the respective contact end is thereby pressed under force or pressure on to the surface of the respective contact region.

17. The method according to claim 1, wherein joining the contact end of the contact element includes:
holding and positioning a respective contact element via a holding and positioning device.

18. The method according to claim 1, wherein a respective contact end of the contact element is contact-connected at one location or at one point as an individual foot region configured to transmit current and/or potential.

19. The method according to claim 1, wherein a respective contact end of the contact element is contact-connected at a plurality of locations or at a plurality of points as a plurality of foot regions configured to transmit current and/or potential.

20. The method according to claim 1, wherein the contact element is an element selected from the group consisting of: contact wires, bonding wires, litz wires and stamped parts.

21. The method according to claim 1, wherein the contact element comprises at least one material selected from the group consisting of: copper and aluminum.

22. The method according to claim 1, wherein the contact end and/or the contact are formed in meandering fashion.

23. The method according to claim 1, wherein the contact region is a pad.

24. The method according to claim 1, wherein the ultrasonic welding operation includes:
using, in the vicinity of edge regions of the contact regions, a welding direction and/or vibration direction which runs substantially parallel to the direction of the respective edge region in order to avoid detachment of the contact region at the DCB substrate.

25. A power semiconductor module, comprising:
a power semiconductor circuit with contact regions;
a contact element with contact ends mechanically and electrically connected to respective ones of the contact regions via ultrasonically welded contacts; and
a direct copper bonding DCB substrate including a copper or substantially copper-containing layer having a material thickness between approximately 0.1 mm and approximately 1.0 mm;
wherein the contact element is a current tap made of solid copper or substantially copper-containing alloy with a material thickness between approximately 0.1 mm and approximately 3.0 mm and a current-carrying capacity between approximately 50 A and approximately 2000 A;
wherein at least one of the contact regions is part of the copper or substantially copper-containing layer.

26. The power semiconductor module according to claim 25, wherein at least one contact element is a current tap with at least two contact ends contact-connected via contacts with contact regions being foot points.

27. The power semiconductor module according to claim 25, wherein, in the vicinity of edge regions of the contact regions of the DCB substrate, the formed contacts are at a minimum distance from the edge regions which approximately corresponds to the thickness of the contact end contact-connected with the respective contact, the distance being between approximately 0.5 mm and approximately 1.5 mm.

28. The power semiconductor module according to claim 25, wherein, in the vicinity of edge regions of the contact regions of the DCB substrate, the welded area of a contact is at a minimum distance from the edge regions which approximately corresponds to the thickness of the contact ends contact-connected with the respective contact, the distance being between approximately 0.5 mm and approximately 1.5 mm.

29. The power semiconductor module according to claim 25, wherein the welded area of a contact corresponds approximately to one to three times the cross-sectional area of the respective contact element in the region of the respective contact end.

* * * * *